United States Patent
Miyano et al.

(10) Patent No.: US 11,676,650 B2
(45) Date of Patent: Jun. 13, 2023

(54) APPARATUSES AND METHODS FOR DEACTIVATING A DELAY LOCKED LOOP UPDATE IN SEMICONDUCTOR DEVICES

(71) Applicant: Micron Technology, Inc., Boise, ID (US)

(72) Inventors: Kazutaka Miyano, Kanagawa (JP); Yasuo Satoh, Ibaraki (JP); Kenji Mae, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/362,822

(22) Filed: Jun. 29, 2021

(65) Prior Publication Data

US 2021/0358541 A1    Nov. 18, 2021

Related U.S. Application Data

(62) Division of application No. 16/559,344, filed on Sep. 3, 2019, now Pat. No. 11,049,543.

(51) Int. Cl.
*G11C 7/00* (2006.01)
*G11C 11/406* (2006.01)
*H03L 7/081* (2006.01)

(52) U.S. Cl.
CPC ...... *G11C 11/40615* (2013.01); *H03L 7/0812* (2013.01)

(58) Field of Classification Search
CPC .......... G11C 11/40615; H03L 7/0812
USPC .................................... 365/193, 194
See application file for complete search history.

(56) References Cited

U.S. PATENT DOCUMENTS

| | | | |
|---|---|---|---|
| 6,456,130 B1 * | 9/2002 | Schnell | G11C 7/1066 327/158 |
| 6,954,388 B2 | 10/2005 | Thomann et al. | |
| 7,486,119 B2 | 2/2009 | Lee | |
| 7,830,187 B2 * | 11/2010 | Chung | H03L 7/0814 327/158 |
| 8,598,928 B1 | 12/2013 | Choi | |
| 8,811,105 B2 * | 8/2014 | Fujisawa | G11C 11/4093 365/189.04 |
| 9,082,505 B2 * | 7/2015 | Ishikawa | G11C 7/00 |
| 9,570,149 B2 * | 2/2017 | Miyano | G11C 11/4074 |
| 10,049,543 B1 * | 8/2018 | Passe | G08B 13/19 |
| 10,110,240 B1 * | 10/2018 | Satoh | H03L 7/193 |
| 10,892,764 B1 * | 1/2021 | Okuno | H03K 5/135 |

(Continued)

*Primary Examiner* — Viet Q Nguyen
(74) *Attorney, Agent, or Firm* — Dorsey & Whitney LLP

(57) ABSTRACT

A semiconductor device may include a delay locked loop (DLL) control circuit coupled to an update trigger generator and a DLL update circuit. The DLL control circuit may receive an update trigger signal and an internal refresh signal and configured to activate the DLL update circuit responsive to an update trigger in the update trigger signal and deactivate the DLL update circuit responsive to an active internal refresh signal. The DLL update circuit may perform DLL update to one or more memory cell arrays when activated and not perform DLL update to the memory cell arrays when deactivated. The DLL control circuit may reactivate the DLL update circuit once the internal refresh signal becomes inactive. In other scenarios, once the DLL update circuit is deactivated, the DLL update circuit stays deactivated until the next update trigger in the update trigger signal.

20 Claims, 7 Drawing Sheets

(56) References Cited

U.S. PATENT DOCUMENTS

| | | |
|---|---|---|
| 11,049,543 B2 * | 6/2021 | Miyano .................. G11C 7/222 |
| 2002/0000856 A1 | 1/2002 | Jung |
| 2002/0001240 A1 | 1/2002 | Ryu et al. |
| 2002/0064083 A1 | 5/2002 | Ryu et al. |
| 2002/0176302 A1 | 11/2002 | Jung et al. |
| 2003/0067331 A1 | 4/2003 | Drexler |
| 2003/0235106 A1 | 12/2003 | Thomann et al. |
| 2004/0174760 A1 | 9/2004 | Lim et al. |
| 2005/0001663 A1 | 1/2005 | Lee |
| 2005/0185500 A1 | 8/2005 | Park |
| 2007/0133332 A1 | 6/2007 | Chun |
| 2008/0079469 A1 | 4/2008 | Cho |
| 2010/0142296 A1 | 6/2010 | You |
| 2010/0195429 A1 | 8/2010 | Sonoda |
| 2011/0242923 A1 | 10/2011 | Song |
| 2012/0124409 A1 * | 5/2012 | Miyano .................. H03L 7/0814 713/503 |
| 2012/0195090 A1 | 8/2012 | Hayashi et al. |
| 2012/0212273 A1 | 8/2012 | Nguyen et al. |
| 2013/0028037 A1 | 1/2013 | Fujisawa |
| 2013/0031305 A1 * | 1/2013 | Fujisawa .............. G11C 29/028 711/106 |
| 2013/0314135 A1 | 11/2013 | Choi |
| 2015/0162068 A1 | 6/2015 | Woo et al. |
| 2020/0005856 A1 | 1/2020 | Mazumder |

* cited by examiner

APPARATUSES AND METHODS FOR DEACTIVATING A DELAY LOCKED LOOP UPDATE IN SEMICONDUCTOR DEVICES

CROSS-REFERENCE TO RELATED APPLICATION

This application is a divisional of U.S. patent application Ser. No. 16/559,344, filed Sep. 3, 2019, issued as U.S. Pat. No. 11,049,543 on Jun. 29, 2021. This application and patent are incorporated by reference herein in their entirety and for all purposes.

BACKGROUND

A semiconductor memory device, such as a DRAM (Dynamic Random Access Memory), includes memory cell arrays each having memory cells disposed at intersections between word lines and bit lines. The memory device also includes a delay locked loop (DLL) to adjust the phase lock level between an external clock signal and an internal phase locked clock signal so that the input/output (I/O) driver receives data that arrives in line with the external clock signal.

Various conditions in the memory device, such as temperatures, voltages in the power supply, propagation delays etc. may cause the phase lock level in the DLL update circuit to vary. For example, a common voltage supply may be provided to each of the memory cell arrays in the memory device. When an activation of the memory cell arrays occurs, the associated operation on the memory cell arrays may adversely affect the conditions of the memory device, and consequently causes the DLL update circuit to variably change the phase lock level. However, certain condition changes to the memory device may be significant to cause the DLL update circuit to work harder than normal. For example, when refresh operations on the memory cell arrays occur, the common power supply may change due to the significant load change associated with the memory refresh operation. For example, eight rows (word lines) may be activated at a time during a memory refresh. As a result, the VDD voltage may decrease and the VSS voltage may float. This power supply change may result in the phase lock level in the DLL update circuit varying significantly. When the memory operations are complete, it may take time for the phase lock level in the DLL update circuit to be adjusted to the desired level. As such, certain actions to memory cell arrays, such as refresh operation, may affect the performance of the DLL update even when the memory is not in a refresh operation.

DETAILED DESCRIPTION

In some embodiments of the disclosure, adjustment of a DLL is deactivated when one or more memory cell arrays are activated (e.g., for a memory refresh operation. The DLL may be adjusted during a next adjustment time for the DLL in some embodiments of the disclosure. The DLL may be adjusted when the one or more memory cell arrays are deactivated in some embodiments of the disclosure.

A semiconductor device may include a DLL control circuit coupled to an update trigger generator and a DLL update circuit. The DLL control circuit may receive an update trigger signal from the update trigger generator. The update trigger signal may include multiple triggers (e.g., pulses). The DLL control circuit may activate the DLL update circuit responsive to an update trigger in the update trigger signal. The DLL control circuit may be configured to deactivate the DLL update circuit when one or more memory cell arrays are activated (e.g., memory refresh operation). The DLL update circuit may perform a DLL update to one or more memory cell arrays when activated and not perform DLL update to the memory cell arrays when deactivated. In some embodiments, once the DLL update circuit is deactivated, the DLL update circuit stays deactivated until the next update trigger in the update trigger signal arrives. In other embodiments, the DLL control circuit may reactivate the DLL update circuit once the one or more memory cell arrays are deactivated (e.g., a refresh operation on the one or more memory cell arrays is completed).

Figure 1:
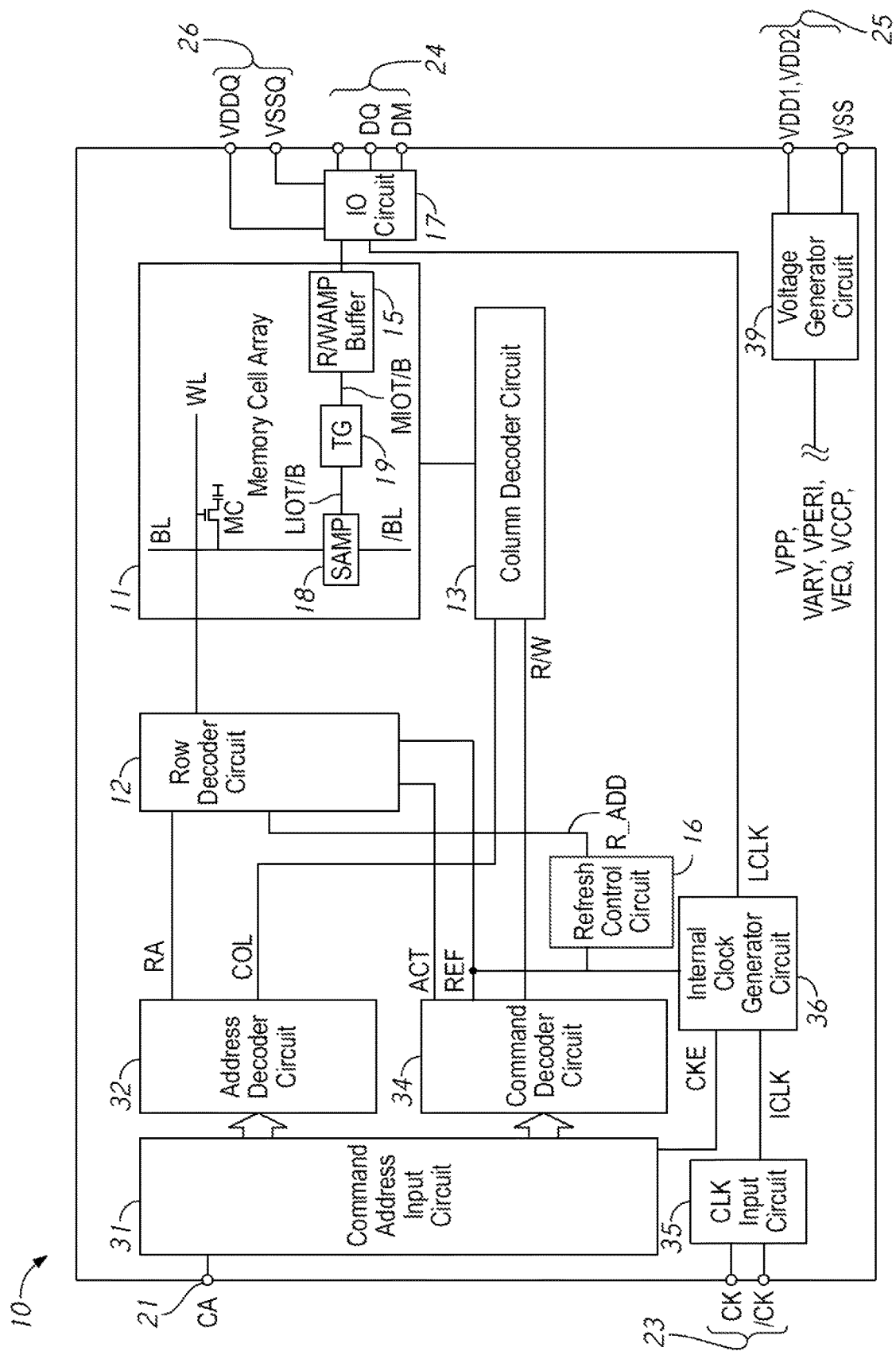
FIG. 1 is a block diagram of a semiconductor device according to some examples described in the disclosure.

FIG. 1 is a block diagram of a semiconductor device 10 according to some examples described in the disclosure. The semiconductor device 10 may be a dynamic random access memory (DRAM) in some embodiments of the disclosure. The semiconductor device 10 includes a memory cell array 11. The memory cell array 11 includes a plurality of word lines WL and a plurality of bit lines BL that intersect each other, with memory cells (MC) disposed at the intersections. The selection of a word line WL is carried out by a row decoder circuit 12, and the selection of the bit line BL is carried out by a column decoder circuit 13.

With further reference to FIG. 1, the sense amplifiers 18 are coupled to corresponding bit lines BL and coupled to local I/O line pairs LIOT/B. Local IO line pairs LIOT/B are coupled to main IO line pairs MIOT/B via transfer gates TG 19 which function as switches to read/write amplifiers and buffers 15. Turning to the explanation of a plurality of external terminals included in the semiconductor device 10, the plurality of external terminals includes command and address terminals 21, clock terminals 23, data terminals 24, and power supply terminals 25 and 26.

The command and address terminals 21 are supplied with command and address signals CA. The CA signals provided to the command and address terminals 21 include commands and addresses. Addresses included in the CA signals are transferred via a command/address input circuit 31 to an address decoder circuit 32. The address decoder circuit 32 receives the addresses and supplies a decoded row address signal RA to the row decoder circuit 12, and a decoded column address signal COL to the column decoder circuit 13.

Commands included in the CA signals provided to the command and address terminals 21 are input to a command decoder circuit 34 via the command/address input circuit 31. The command decoder circuit 34 decodes the commands to provide various internal command signals. For example, the internal commands may include a row command signal to select a word line and a column command signal to select a bit line.

When a row activation command is issued and a row address is timely supplied with the activation command, and a column address is timely supplied with a read command, read data is read from a memory cell MC in the memory cell array 11 designated by these row address and column address. More specifically, the row decoder circuit 12 selects a word line WL indicated by the row address RA so that the associated memory cell MC is subsequently connected to the bit line BL. The read data DQ is output externally from the data terminals 24 via a read/write amplifier 15 and an input/output circuit 17. Similarly, when the row activation command is issued and a row address are timely supplied with the activation command, and a column address is timely supplied with a write command, the input/output circuit 17 may receive write data DQ at the data terminals 24. The write data DQ is supplied via the input/output circuit 17 and the read/write amplifier 15 to the memory cell array 11 and written in the memory cell MC designated by the row address and the column address.

The device 10 may include a refresh control circuit 16 for carrying out refresh operations. During a refresh operation, memory cells associated with one or more word lines may be refreshed. The refreshing of a word line may be referred to as a refresh, and a refresh operation may include multiple refreshes. The refresh operations may be an auto-refresh operation and/or other refresh operations. In some embodiments, a refresh command may be externally issued to the device 10 and provided to the command decoder circuit 34 which provides the command to the refresh control circuit 16 and row decoder circuit 12. In some embodiments, the refresh command may be periodically provided by a component of the device 10 (e.g., internally by the refresh control circuit 16 or the command decoder circuit 34). The refresh control circuit 16 may provide a refresh address R_ADD to the row decoder circuit 12, which may indicate a row address for performing a refresh operation. As will be described in more detail, a word line (e.g., subword line) indicated by the refresh address R_ADD may be refreshed across multiple memory mats and/or memory banks during a refresh operation.

The clock terminals 23 are supplied with external clock signals CK and /CK, respectively. These external clock signals CK and /CK are complementary to each other and are supplied to a clock input circuit 35. The clock input circuit 35 receives the external clock signals CK and /CK and provides an internal clock signal ICLK. The internal clock signal ICLK is supplied to an internal clock generator 36 and thus a phase controlled internal clock signal LCLK is provided based on the received internal clock signal ICLK and a clock enable signal CKE from the command/address input circuit 31. In a non-limiting example, a DLL circuit may be included in the internal clock generator 36. The phase controlled internal clock signal LCLK is supplied to the input/output circuit 17 and is used as a timing signal for determining an output timing of the read data DQ.

In some examples, the internal clock generator 36 may include a DLL control circuit coupled to a DLL update circuit. The DLL control circuit may be provided with an update trigger signal from an update trigger generator (e.g., CLK input circuit 35 or an oscillator internal to the internal clock generator 36). The update trigger signal may include multiple triggers (e.g., pulses) that arrive periodically. The update trigger signal may be provided to the DLL control circuit to activate the DLL update circuit of the semiconductor device. A DLL update circuit may be configured to perform DLL updates by accounting for the various delays in the circuit and provide phase controlled internal clock signal LCLK to control the timing of when data at the input/output (I/O) drivers of the IO circuit 17 is provided.

In some examples, the DLL control circuit in the internal clock generator circuit 36 may also be provided with an internal refresh signal (e.g., refresh command). The DLL update may be performed periodically responsive to an update trigger, whereas the update trigger is provided independently of the activation of the memory cell (e.g., refresh command). The DLL control circuit may be configured to deactivate an in-process DLL update responsive to an active refresh signal (e.g., at a high logical level). In some examples, once the DLL update is deactivated responsive to the internal refresh signal, the DLL update may be activated again once the internal refresh signal becomes inactive (e.g., at a low logical level). In other scenarios, once the DLL update is deactivated, the DLL update may stay deactivated until the next update trigger.

The power supply terminals 25 are supplied with power supply voltages VDD1, VDD2 (collectively referred to as VDD), and VSS. These power supply voltages VDD1, VDD2, and VSS are supplied to an internal voltage generator circuit 39. The internal voltage generator circuit 39 provides various internal voltages VPP, VARY, VPERI, VEQ, and VCCP.

The internal potential VCCP is a potential to be mainly used in the row decoder circuit 12. The internal potential VARY and VEQ are potentials to be used by the sense amplifier 18, transfer gates 19 and/or read/write amplifiers 15. When the sense amplifier 18 is activated, the read data read out is amplified by driving one of the paired bit lines to a VARY level with the other one being driven to a VSS level. The internal potential VPERI is used as a power supply potential for most of the peripheral circuits, such as the command/address input circuit 31. By using the internal potential VPERI having a lower potential than the external potential VDD as the power supply potential of these peripheral circuits, it may be possible to reduce power consumption of the semiconductor device 10.

The power supply terminals 26 are supplied with power supply voltages VDDQ and VSSQ. These power supply voltages VDDQ and VSSQ are supplied to the input/output circuit 17. The power supply voltages VDDQ and VSSQ may be the same voltages as the power supply voltages VDD2 and VSS that are supplied to the power supply terminals 25, respectively. However the dedicated power supply voltages VDDQ and VSSQ may be used for the input/output circuit 17 so that power supply noise generated by the input/output circuit 17 does not propagate to the other circuit blocks of device 10.

Figure 2:
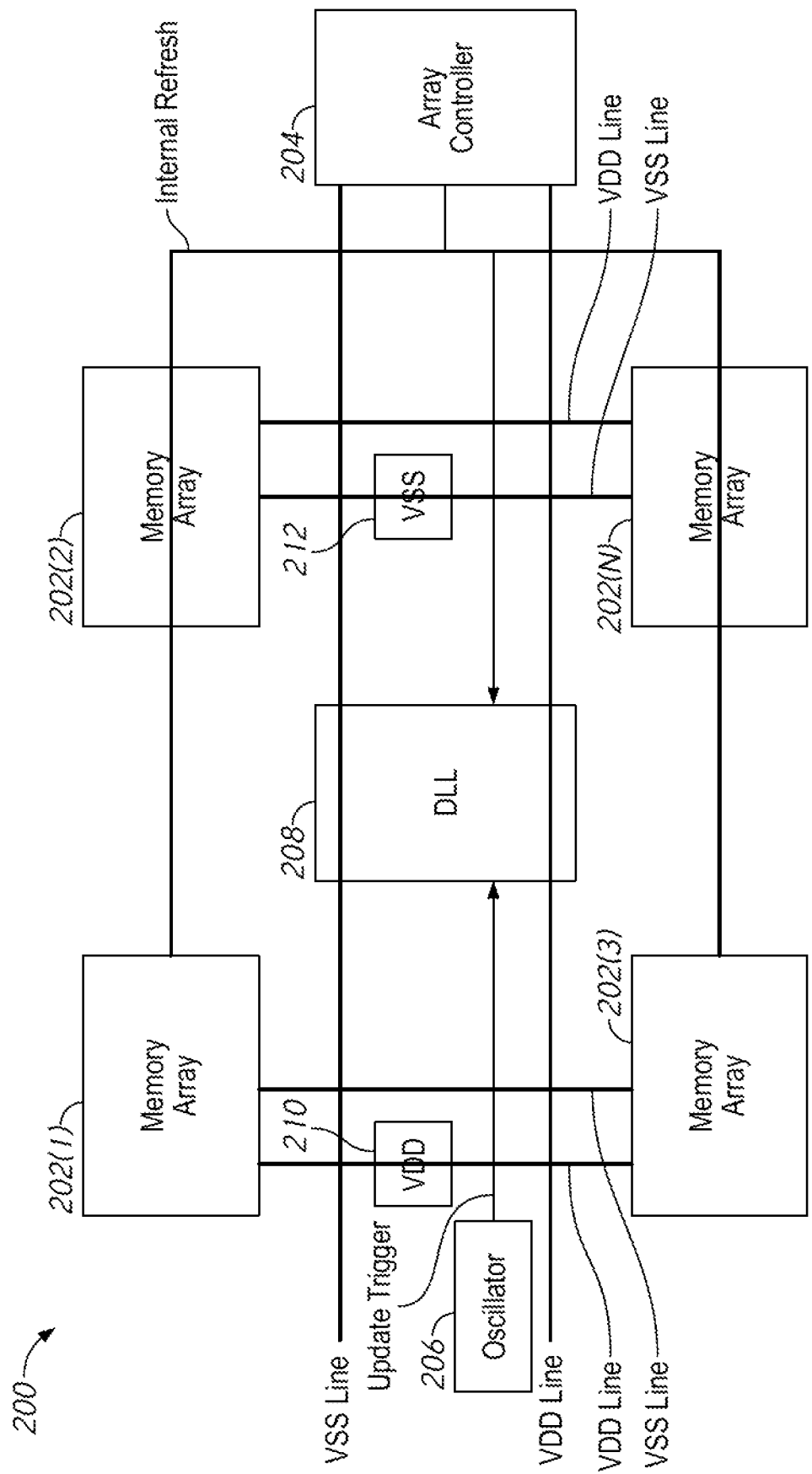
FIG. 2 is a diagram of an example layout of a semiconductor device according to some examples described in the disclosure.

FIG. 2 is a diagram for an example layout of a memory cell array of a semiconductor device 200 according to an embodiment of the disclosure. In some embodiments of the disclosure, the semiconductor device 200 includes multiple memory arrays 202(1), 202(2), . . . , 202(N), which are controlled by an array controller 204. The memory arrays may be included in the memory cell array 11 (in FIG. 1). The array controller 204 may be included in a circuit in the semiconductor device 10, such as the row decoder circuit 12, the column decoder circuit 13, the address decoder circuit 32, the command decoder circuit 34 (FIG. 1) or other circuits. The memory arrays 202(1), . . . , 202(N) and the array controller 204 are provided with the power voltages through common VDD and VSS lines. The VDD and VSS lines are respectively provided with power potentials VDD and VSS by the VDD and VSS power supplies 210 and 212. In some examples, the VDD and VSS power supplies 210, 212 may be included in the voltage generator circuit 39 (FIG. 1).

The semiconductor device 200 may further include DLL control circuit 208. In some examples, the DLL control circuit 208 may be provided with an update trigger signal from an update trigger generator 206 (e.g., an oscillator). Multiple update triggers in the update trigger signal may cause the DLL control circuit 208 to periodically activate a DLL update circuit (not shown) of the semiconductor device. A DLL update circuit may be configured to perform a DLL update by accounting for the various delays in the circuit and providing phase synchronization between the system clock (e.g., ICLK in FIG. 1) and phase controlled internal clock signal (e.g., LCLK in FIG. 1) to control the timing of when data at the input/output (I/O) drivers of the memory cell arrays are provided.

In some examples, the DLL control circuit 208 may also be provided with an internal refresh signal (e.g., Refresh command). The DLL update may be performed periodically responsive one or more update triggers, whereas the update triggers are provided independently of the activation of the memory cell (e.g., refresh). In some cases, a DLL update is in process and a refresh signal becomes active indicating a refresh operation. In such case, the DLL control circuit 208 may be configured to deactivate the DLL update responsive to the active refresh signal. In some examples, once the DLL update is deactivated due to the refresh signal, the DLL update may be activated again once the internal refresh signal becomes inactive. In other scenarios, once the DLL update is deactivated, the DLL update may stay deactivated until the next update trigger arrives. Further details of the DLL control circuit 208 are described with reference to FIGS. 3-7.

Figure 3:
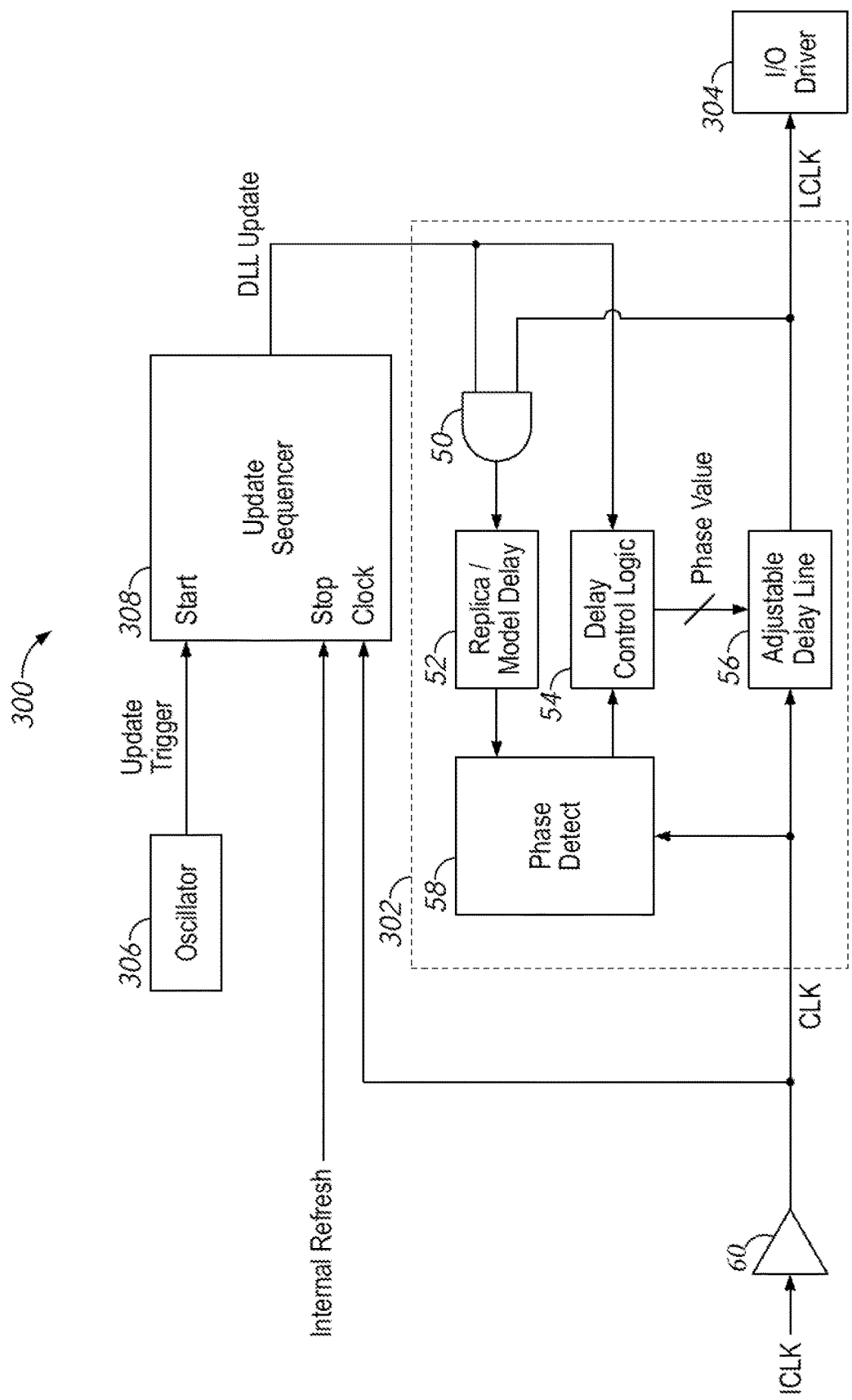
FIG. 3 is a diagram of a DLL control circuit according to some examples described in the disclosure.

FIG. 3 is a diagram of a DLL control circuit according to some examples described in the disclosure. In some examples, a DLL control circuit 300 may be coupled to a DLL update circuit 302 and configured to provide a DLL update signal to the DLL update circuit. The DLL control circuit 300 may include an update sequencer 308 configured to receive the update trigger signal from the update trigger generator 306, and to provide a DLL update signal to activate the DLL update circuit 302 responsive to an update trigger in the update trigger signal. In some examples, the update trigger generator may be an oscillator configured to generate multiple update triggers. Each update trigger may include a pulse. In other words, an update trigger signal may include multiple pulses.

In some examples, the DLL update circuit 302 may be implemented in the internal clock generator circuit (e.g., 36 in FIG. 1) and configured to provide a phase controlled internal clock signal LCLK, which is provided to the I/O driver 304 for feeding/reading data to/from memory cell arrays. In some examples, the DLL update circuit 302 may include an adjustable delay line 56 configured to provide a phase change to the LCLK based on the internal clock ICLK. The DLL update circuit 302 may also include a delay control logic 54 coupled to the adjustable delay line 56 and configured to provide a phase value to the adjustable delay line 56 to control the amount of delay of the adjustable delay line.

In some examples, the DLL update circuit 302 may include a phase detect circuit 58 configured to compare the phase between the internal clock CLK and the phase controlled internal clock LCLK which is provided through a replica/model delay circuit 52. The result of the comparison is provided to the delay control logic 54 to provide the phase value to the adjustable delay line 56. In some examples, the replica/model delay circuit 52 may account for further delay from the output of the adjustable delay line 56 to the I/O driver 304. The further delay may be caused by the propagation in the circuit, clock tree delay and/or other possible delays. These possible delays may be modeled in the replica/model delay circuit 52. As such, when the adjusted delay in the LCLK provided by the delay line 56 has reached the I/O driver 304, it will be lined up with the internal clock ICLK to facilitate accurate data operations (read/write) in the memory cell arrays.

In some examples, the DLL update circuit 302 may include an activation circuit 50 configured to activate/deactivate the DLL update circuit. The activation circuit 50 may include an AND gate having an input terminal coupled to the output of the adjustable delay line 56. A second input terminal of the activation circuit 50 may be coupled to the DLL control circuit to receive the DLL update signal. The activation circuit 50 may be coupled to the replica/model delay circuit 52. When the DLL update signal is active (e.g., at a high logical level), the activation circuit 50 may pass the output of the adjustable delay line 56 to the replica/model delay circuit 52. When the DLL update signal is inactive (e.g., at a low logical level), the activation circuit 50 may block the output of the adjustable delay line 56, and instead, provide an inactive signal (e.g., a low logical level) to the replica/model delay circuit 52.

In some examples, the delay control logic 54 in the DLL update circuit 302 may also be coupled to the DLL control circuit to receive the DLL update signal. The delay control logic 54 may be configured to be deactivated in response to an inactive DLL update signal (e.g., a low logical level), so that there will be no further adjustment of delays in the adjustable delay line 56. When the DLL update signal becomes active (e.g., switches a high logical level), the delay control logic 54 may be activated again. The various components in FIG. 3 are only example implementations of the DLL update circuit. Other implementations may also be possible.

With further reference to FIG. 3, the update sequencer 308 may be configured to receive an update trigger signal and an activation signal of the memory cell arrays, and provide the DLL update signal to activate the DLL update circuit responsive to an update trigger signal, and to deactivate the DLL update circuit responsive to the activation of the memory cell arrays. In some examples, an activation signal of the memory cell arrays may be a refresh command. The update sequencer 308 may also be coupled to a CLK input circuit (e.g., 35 in FIG. 1) to receive an internal clock. e.g., ICLK via a buffer 60.

Figure 4:
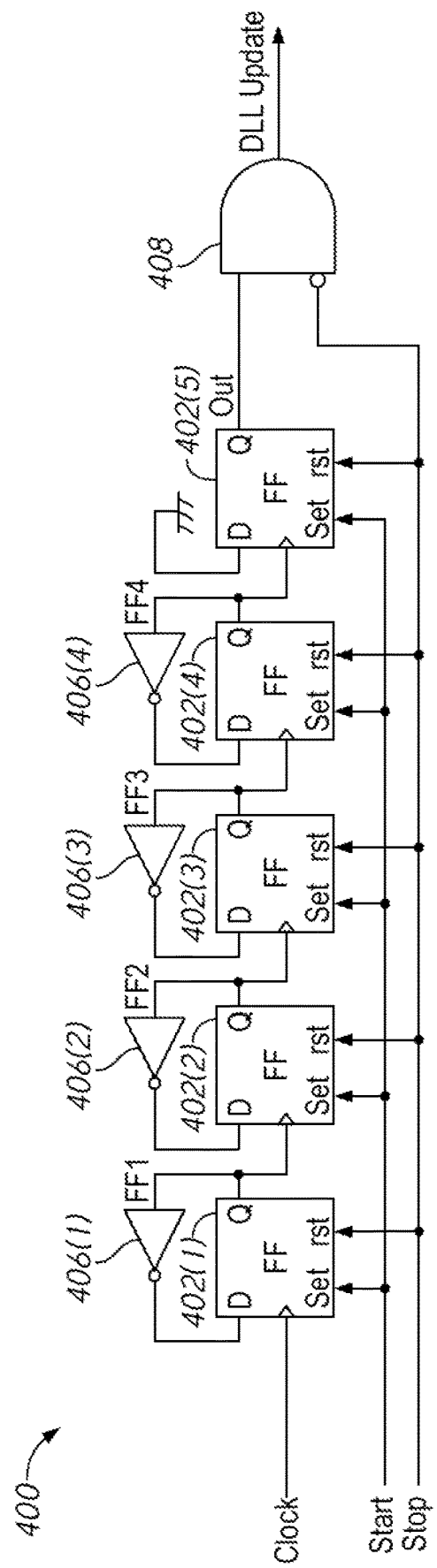
FIG. 4 is an example implementation of a DLL control circuit according to some examples described in the disclosure.

FIG. 4 is an example implementation of a DLL control circuit according to some examples described in the disclosure. In some examples, circuit 400 implements an update sequencer (e.g., 308 in FIG. 3). The circuit 400 may include a series of D flip-flops, e.g., 402(1), . . . , 402(5) serially coupled, in which the Q output of a flip-flop in the serially coupled plurality of flip-flops is coupled to the clock input of the succeeding flip-flop. The clock input of the first flip-flop (e.g., 402(1)) is provided a clock. For example, in the disclosure where the circuit 400 is included in the update sequencer 308, the clock input of the first flip-flop is provided the clock ICLK via the buffer 60. For each of the flip-flops in the plurality of flip-flops (e.g., 402(1)-402(4)), except the last flip-flop (402(5)), the Q output is looped back to the input terminal via an inverting buffer. For example, the output of flip-flop 402(1) is looped to the input terminal via the inverting buffer 406(1). The flip-flops 402(2), 402(3) and 402(4) are configured in a similar manner, via inverting buffers 406(2), 406(3) and 406(4), respectively. The input terminal to the last flip-flip (e.g., 402(5)) is coupled to the ground. The circuit 400 may further include an output circuit 408 configured to provide the DLL update signal. In some examples, the output circuit 408 may include an AND gate having two inputs.

As shown in FIG. 4, a start signal line may be coupled to each of the flip-flops in the plurality of flip-flops at a Set terminal, and a stop signal line may be coupled to each flip-flop at a Reset terminal. The update trigger signal from the update trigger generator (e.g., 206 in FIG. 2, 306 in FIG. 3) may be provided to the start signal line. A memory activation signal (e.g., a refresh command) may be provided to the stop signal line. Responsive to an active start signal (e.g., an update trigger pulse), all of the flip-flops 402 may be set to a high logical level, e.g., a value of one. While the stop signal is inactive (e.g., at low logical level), the signal Out at the output of the last flip-flop 402(5) is passed through the output circuit 408 to provide the DLL update signal. The high logical level at the output of each D flip-flip is latched by each respective flip-flop and can only be changed (to low logical level) when a rising clock edge arrives. Because the clock terminal of each of the flip-flops 402(2), 402(3), 402(4) and 402(5) is coupled to the output terminal of the preceding flip-flops, the output provided at each latch circuit 402(2)-402(5) may take twice as long to change value as the preceding flip-flop. For example, after each pulse, the update trigger signal (at start signal line) becomes a low logical level, the output of the D flip-flop 402(1) alternates its value at every clock cycle of the clock signal. In other words, it will take two clock cycles for the output of the flip-flop 402(1) to finish a complete cycle from high logical value to low logical value and return to high logical value.

With further reference to FIG. 4, because the output of the flip-flop 402(1) is fed into the clock terminal of the succeeding flip-flop 402(2), the output of the succeeding flip-flop 402(2) alternates its value at every two clock cycles of the clock signal. Similarly, the output of flip-flop 402(3) alternates values at every four clock cycles, the output of flip-flip 402(4) alternates values at every eight clock cycles, and the output signal Out from the last flip-flop 402(5) changes from high logical level to low logical level (because the input D is coupled to the ground) at the completion of the eighth clock cycle of the clock signal. As a result, the Out signal (passed through to the DLL update) corresponds to a pulse in an update trigger signal, but has a larger width. Only five flip-flops are shown in FIG. 4, however, fewer or more flip-flips may be used to provide the DLL update depending on the desired width of the DLL update signal.

In some examples, when an activation signal on the stop signal line (e.g., a refresh command) becomes active (e.g., changes from a low logical level to a high logical level), each of the plurality of D flip-flops 402(1)-402(5) becomes inactive (e.g., at low logical level). As a result, the output circuit 408 will provide the output DLL update signal as a low logical level signal through the inverting input of the AND gate 408. This effectively deactivates the DLL update circuit (e.g., 302 in FIG. 3).

Figure 5:
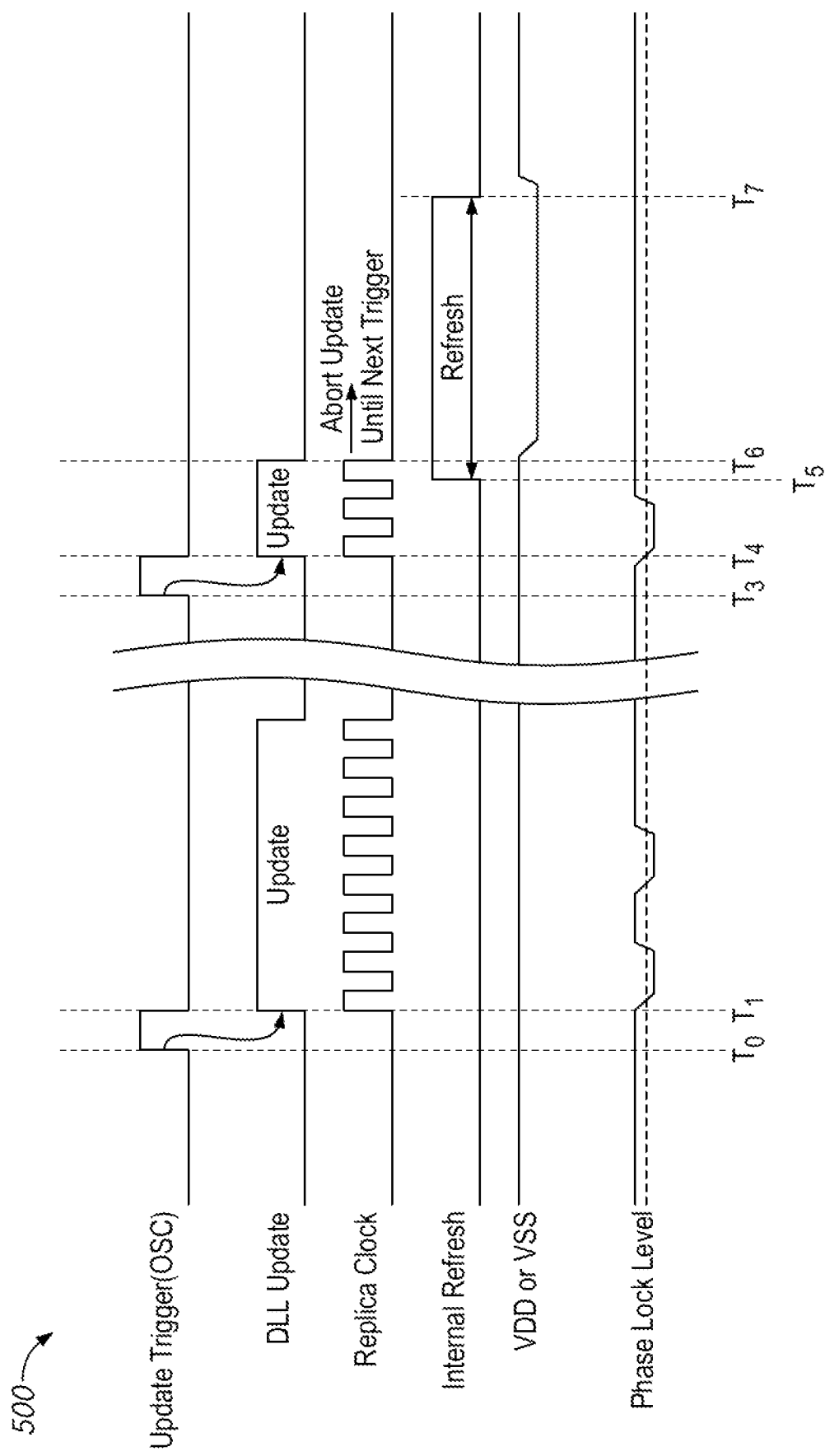
FIG. 5 is a timing diagram of various signals during operation of a DLL control circuit according to some examples described in the disclosure.

FIG. 5 is a timing diagram of various signals during operation of a DLL control circuit according to some examples described in the disclosure. In some examples, DLL control circuit 300 (in FIG. 3) and/or DLL control circuit 400 (in FIG. 4) may be operated as described with reference to FIG. 5. FIG. 5 will be described with reference to the DLL update control circuits of FIGS. 3 and 4 by way of example.

In operation, an update trigger signal may include multiple triggers (e.g., pulses), such as the pulses at time T0 and T3. As shown in FIG. 3, the update trigger signal may be provided by an update trigger generator 306 (e.g., an oscillator). Other methods of generating the update trigger signal may also be available. Responsive to each pulse in the update trigger signal, with reference to FIG. 4, the plurality of serially coupled D flip-flops (e.g., 402(1), . . . , 402(5)) may be configured to generate the DLL update signal as a wider pulse at time T1. The width of the DLL update signal may be controlled by the number of D flip-flops used in the serially coupled plurality of D flip-flops (see FIG. 4). In other words, fewer or more flip-flops may be used to configure the width of the DLL update signal to a desired width.

With reference to FIG. 3, the DLL update pulse is provided to the replica/model delay circuit 52 through the activation circuit 50. In response the DLL update signal becoming active at time T1, the DLL update circuit 302 is activated, and the replica/model delay circuit 52 provides a replica clock signal (shown in FIG. 5), which is provided to the phase detect circuit 58 to compare the phases as described with reference to FIG. 3. In the example of FIG. 5, the phase value (Phase Lock Level) provided by the delay control logic 54 changes during the DLL update time to adjust the adjustable delay line 56, shown as the Phase Lock Level changing from being above a lock level to below the lock level and changing again.

Returning to FIG. 5, the next pulse in the update trigger signal may arrive at time T3. Similarly, the DLL update signal becomes active at time T4, where the width of the pulse in the DLL update signal is controlled by the update sequencer 308 and described in detail with reference to FIG. 4. At time T5, the memory cell arrays become active. For example, an internal refresh command is activated (e.g., as indicated by a rising edge) at T5. The internal refresh signal is provided to the stop terminal of the update sequencer (308 in FIG. 3) and the Reset terminals of the serially coupled flip-flops (e.g., flip-flops 402 in FIG. 4). As described in FIG. 4, the activation of the internal refresh signal causes the output of the DLL update signal to be inactive (e.g., at low logical level). As shown in FIG. 5, the DLL update signal become inactive at time T6 responsive to the active internal refresh signal. In comparison to the DLL update signal at time T1, the pulse width of the DLL update signal is reduced in response to the activation of the internal refresh command. The deactivation of the DLL update signal may cause the DLL update circuit to deactivate (e.g., deactivate activation circuit 50 and delay control logic 54 in FIG. 3), until the next update trigger arrives.

With further reference to FIG. 5, in response to the activation of the internal refresh signal, the power supplies VDD or VSS may change due to the circuit load change. In some examples, the activation of the internal refresh signal may cause the voltage potential VDD to decrease and the voltage potential VSS to float. By shutting off the DLL update at T6, the phase lock level (e.g., the output of the delay control logic 54, in FIG. 3) will remain constant. This may effectively isolate the effect of VDD/VSS due to the activation of the memory cell arrays (e.g., the internal refresh command) so that the DLL update is minimally affected. As noted in FIG. 5, once the DLL update signal becomes inactive (e.g., low logical level), the DLL update signal will stay inactive until the next active update trigger. In other words, once the DLL update circuit is deactivated, it will stay deactivated until the next active update trigger.

Figure 6:
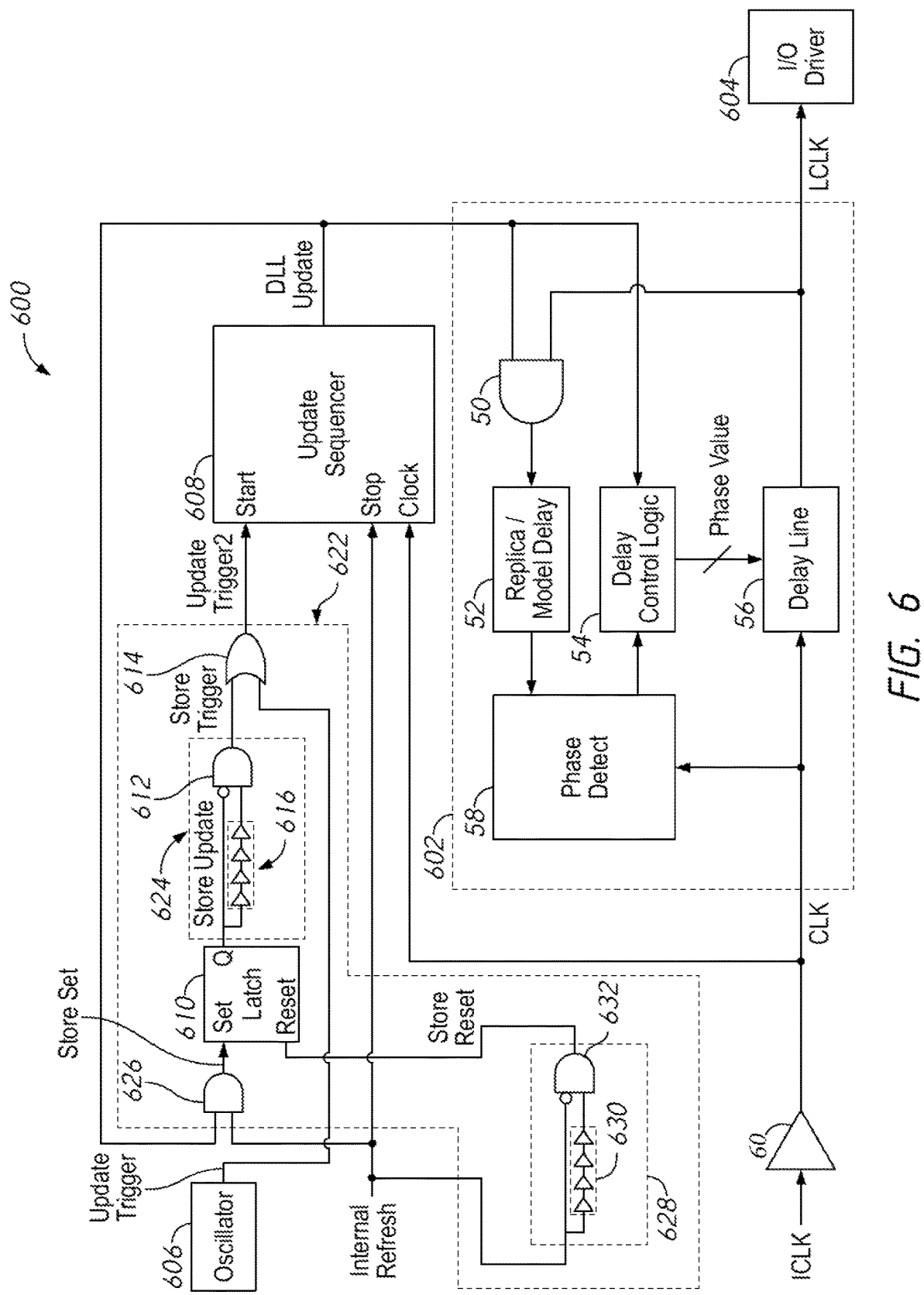
FIG. 6 is a diagram of another embodiment of a DLL control circuit according to some examples described in the disclosure.

FIG. 6 is a diagram of another embodiment of DLL control circuit according to some examples described in the present disclosure. In some examples, the DLL control circuit 600 may be configured to deactivate the DLL update circuit responsive to an update trigger and the deactivation lasts for the duration of the refresh command. For example, the DLL update circuit 602 may be activated again when the internal refresh signal becomes inactive. When the memory refresh operation is completed, at which time the effect on VDD/VSS from the refresh operation is diminished, the DLL update circuit may be configured to activate again. Now, the details of the embodiment of DLL control circuit 600 is further explained.

In some examples, the DLL control circuit 600 may include an update sequencer 608 configured to provide the DLL update signal. The DLL control circuit 600 may further include a trigger circuit 622 coupled to an update trigger generator 606 and the update sequencer 608. The update trigger generator 606 (e.g., an oscillator) may be configured to generate an update trigger signal. The update trigger signal may include multiple activation pulses provided to the trigger circuit 622. The trigger circuit 622 may also be coupled to an internal refresh command line and configured to provide an internal update trigger signal, e.g., update trigger2 signal, which is further provided to the update sequencer 608. Similar to the update trigger signal, the internal update trigger signal (e.g., update trigger2) may include multiple triggers (e.g., pulses). The update sequencer 608 may be configured in a similar manner as the update sequencer 308 (in FIG. 3) and coupled to the update trigger generator 606, with the difference that the trigger circuit 622 is coupled between the update trigger generator 606 and the update sequencer 608 to provide the internal update trigger signal update trigger2.

With further reference to FIG. 6, in some examples, the trigger circuit 622 may include a logic gate 614 that combines two signals to provide the internal update trigger signal, e.g., update trigger2. In some examples, the logic gate 614 may be an OR gate with two inputs respectively coupled to a pulse generator 624 and the update trigger generator 606. In some examples, the update trigger generator 606 may be configured in a similar manner as the update trigger generator 306 (in FIG. 3). For example, the update trigger generator 606 may be an oscillator. An update trigger signal may include multiple pulses. Each of the pulses is passed through the logic gate 614 to provide a respective pulse in the update trigger2 signal. The update trigger2 signal is further provided to the update sequencer 608. Similar to what is described in the present disclosure with reference to FIG. 3, the update sequencer 608 may generate a DLL update signal, e.g., a delayed pulse responsive to the pulse provided from the update trigger generator 606.

Additionally. and/or alternatively, the pulse generator 624 may be coupled to the output of the DLL control circuit 600 to receive the DLL update signal. The pulse generator 624 may include a latch circuit 610 configured to latch the update trigger signal and provide at the output a store update signal, which is further provided to a first input of a combiner circuit 612. The store update signal is further provided to a second input of the combiner circuit 612 through a delay circuit 616.

In some examples, the latch circuit 610 may be a RS flip-flop with the Set terminal coupled to set circuit 626 and the Reset terminal coupled to a reset circuit 628. The set circuit 626 may also be coupled to the internal refresh command line. In some examples, the set circuit 626 may include a AND gate configured to receive the DLL update signal from the DLL control circuit 600 and the internal refresh signal from the internal refresh command line and provide a store set pulse. The trigger circuit 622 may also include the reset circuit 628. The reset circuit 628 may be coupled to the internal refresh command line to receive the internal refresh signal and provide a store reset pulse to the Reset terminal of the RS flip-flop circuit 610. In such configuration, a pulse in the update trigger signal will cause the trigger circuit 622 to provide a pulse in the update trigger 2 signal. The active pulse in the update trigger 2 signal may cause the DLL control circuit 600 to provide an active DLL update signal (e.g., at a high logical level). While the DLL update signal is active (before subsequent pulses in the update trigger signal arrive), the inactive internal refresh signal (e.g., at a low logical level) cause the set circuit 626 to provide the store set signal at a low logical level until the internal refresh signal becomes active (e.g., switching from low logical level to high logical level). At this time the store set signal at the output of the set 626 switches to a logical high level until the DLL update signal becomes inactive (e.g., switches to a logical low level). Responsive to the pulse in the store set signal, the store update at the output of the RS flip-flop circuit 610 switches from the low logical level to the high logical level.

In some examples, the combiner circuit 612 is an AND gate with the first input inverted. In such case, when an inverted pulse in the store update signal (e.g., at low logical level) is combined with a delayed pulse in store update signal (e.g., at high logical level), the combined store trigger signal is a pulse following a falling edge of the store update signal, with the width of the pulse controlled by the delay in the delay circuit 616. Consequently, the update trigger2 signal is provided as a pulse following the falling edge of the store update signal. The reset circuit 628 may be configured in a similar manner as the pulse generator 624 and configured to generate a pulse in the store reset signal responsive to an active internal refresh signal (e.g., at a high logical level). The pulse in the store reset signal may cause the output of the RS flip-flop circuit 610 to reset, which may cause the store update signal to become inactive (e.g., at a logical low level). This falling edge of the store update signal may provide a pulse in the store trigger signal and the update trigger2 signal.

In sum, a pulse in the update trigger2 signal is provided responsive to either an update trigger pulse provided by the update trigger generator 606 or responsive to a falling edge of the internal refresh signal. This update trigger2 signal effectively acts as an update trigger signal to the update sequencer 608. The update sequencer 608 is configured and operated in a similar manner as the update sequencer 308 (in FIGS. 3 and 4) and provides the DLL update pulse signal responsive to the pulse in the update trigger2 signal. Similar to the DLL control circuit (300 in FIG. 3), the DLL control circuit 600 also provides the DLL update signal to activate or deactivate the DLL update circuit 602, where a rising edge of the DLL update signal (pulse) activates the DLL update circuit and a falling edge of the DLL update signal (pulse) deactivates the DLL update circuit. The DLL update circuit 602 may be configured in a similar manner as the DLL update circuit 302 (in FIG. 3). Other configurations of the DLL update circuit may also be possible.

Figure 7:
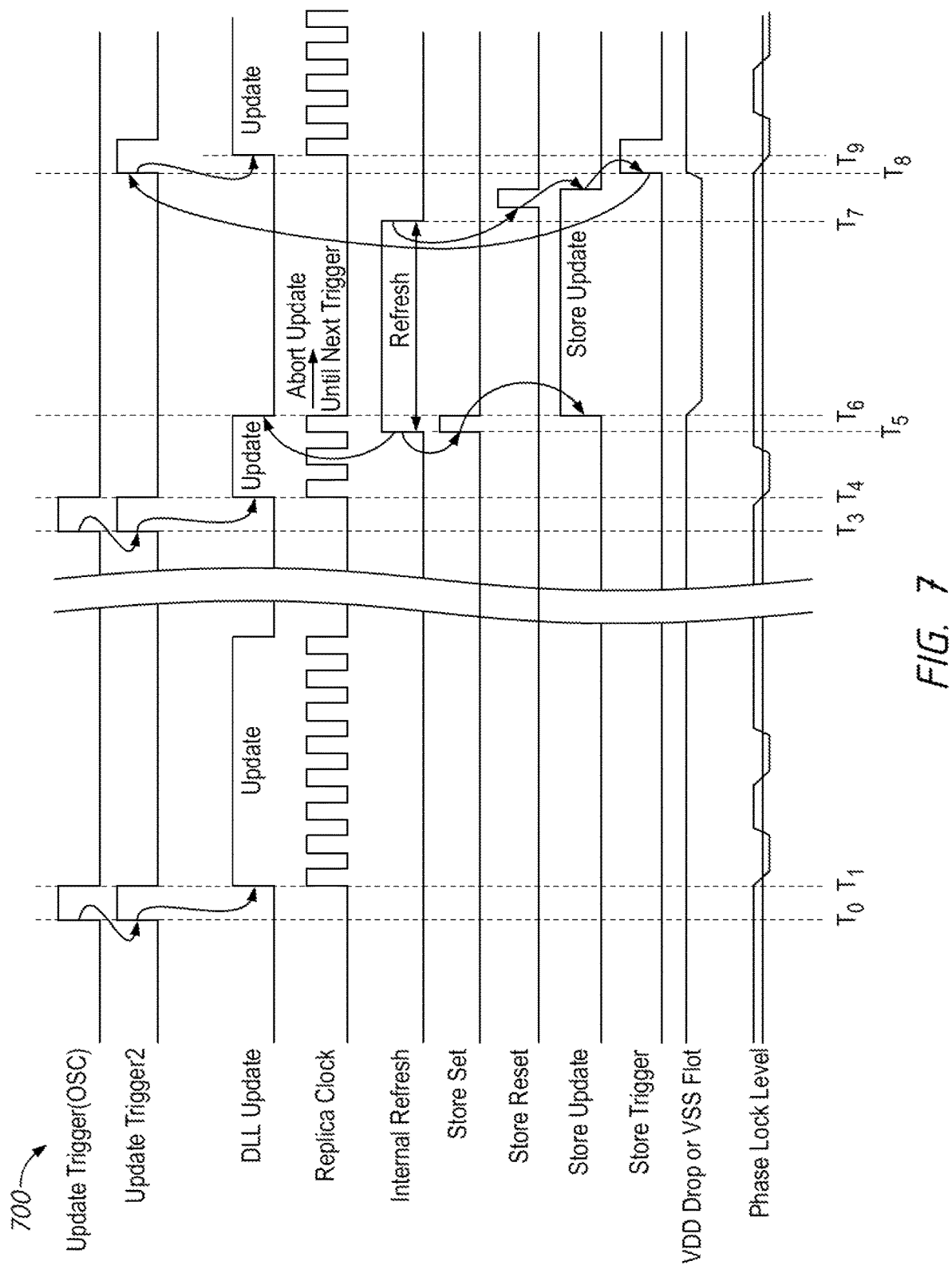
FIG. 7 is a timing diagram of various signals during operation of a DLL control circuit according to some examples described in the disclosure.

FIG. 7 is a timing diagram of various signals during operation of a DLL update control circuit according to some examples described in the disclosure. In some examples, the DLL update control circuit of FIG. 6 may be operated as described with reference to FIG. 7. FIG. 7 will be described with reference to the DLL update control circuit of FIG. 6 by way of example.

In operation, the update trigger signal may include multiple triggers (e.g., pulses), such as the pulses at time T0 and T3. As shown in FIG. 6, the update trigger signal may be provided by an update trigger generator 606 (e.g., an oscillator). Other methods of generating the update trigger signal may also be available. Like FIG. 3, the circuit 400 in FIG. 4 may also be an example implementation of the update sequencer 608 in FIG. 6. Responsive to each pulse in the update trigger signal, with reference to FIG. 4, the plurality of serially coupled D flip-flops (e.g., 402(1), . . . , 402(5)) may be configured to generate the DLL update signal as a wider pulse (than the pulse width of the update trigger) at time T1. The width of the DLL update may be controlled by the number of D flip-flops included in the serially coupled plurality of D flip-flops (see FIG. 4). In other words, fewer or more flip-flops may be used to configure the width of the DLL update signal to a desired width.

With reference to FIG. 6, the DLL update pulse is provided to the replica/model delay circuit 52 through the activation circuit 50. In response to an active DLL update signal, the DLL update circuit 602 is activated, and the replica/model delay circuit 52 generates corresponding replica clock (shown in FIG. 7), which is provided to the phase detect circuit 58 to compare the phases as described with reference to FIGS. 3 and 6.

Returning to FIG. 7, the next pulse in the update trigger signal may arrive at time T3. Similarly, the DLL update signal provided by the DLL control circuit (e.g., 600 in FIG. 6) becomes an active pulse at time T4, where the width of the pulse is controlled by the update sequencer 608 and described in detail with reference to FIG. 4. At this time, the Set terminal of the RS flip-flop circuit (610 in FIG. 6) becomes inactive due to the set circuit 626 (in FIG. 6), which causes the RS flip-flop to provide a low logical level voltage. At time T5, an activation of the memory cell arrays has arrived. For example, an internal refresh command is activated (e.g., at a rising edge) at T5. The internal refresh command is provided to the stop terminal of the update sequencer (608 in FIG. 6), e.g., the Reset terminals of the serially coupled flip-flops (e.g., D flip-flops 402 in FIG. 4). As described in FIG. 4, the activation of the internal refresh command causes the output of the DLL update to be inactive (e.g., at low logical level). As shown in FIG. 7, the DLL update signal becomes inactive at time T6. The inactive DLL update signal will deactivate the DLL update circuit (e.g., by deactivating the activation circuit 50 and delay control logic 54 in FIG. 6), until the next update trigger (e.g., update trigger2). Further, responsive to the activation of the internal refresh signal, the set circuit (626 in FIG. 6) provides an active pulse, which triggers the store update signal to become active (e.g., switches from low logical level to high logical level). The store update signal stays active until the inactivation of the internal refresh signal.

With further reference to FIG. 7, the internal refresh command becomes inactive (e.g., switches from high logical level to low logical level) at time T7. This causes the reset circuit (628 in FIG. 6) to provide a pulse in the store reset signal, which subsequently causes the store update signal to become inactive. Responsive to the store update signal becoming inactive (e.g., switching from high logical level to low logical level), the pulse generator 624 provides a pulse in the store trigger signal at time T8. This effectively provides a pulse in the update trigger2 signal, which causes the DLL control circuit to provide an active DLL update signal at time T9. The active DLL update signal subsequently reactivate the DLL update circuit (e.g., 602 in FIG. 6). As noted, the activation of the DLL update circuit does not wait for the next pulse in the update trigger signal (e.g., update trigger) provided by the update trigger generator (e.g., 606 in FIG. 6). Rather, the activation (reactivation) of the DLL update circuit is in response to the falling edge of the internal refresh command. In other words, the DLL update circuit is deactivated for the duration of the internal refresh command.

With further reference to FIG. 7, in response to the activation of the internal refresh signal, the power supplies VDD or VSS may change due to the circuit load change. In some examples, the activation of the internal refresh signal may cause the voltage potential VDD to decrease and the voltage potential VSS to float. By shutting off the DLL update at T6, the phase lock level (e.g., the output of the phase detect circuit 58, in FIG. 3) will cease to adjust. This may effectively isolate the effect of VDD/VSS due to the activation of the memory cell arrays (e.g., the internal refresh signal) and so that the DLL update is minimally affected. As noted in FIG. 7, once the DLL update signal becomes inactive (e.g., low logical level), the DLL update signal will stay inactive until the completion of the refresh operation on the memory cell arrays. In other words, once the DLL update circuit is deactivated, it will stay deactivated until the completion of the refresh operation of the memory.

From the foregoing it will be appreciated that, although specific embodiments of the disclosure have been described herein for purposes of illustration, various modifications may be made without deviating from the spirit and scope of the disclosure. For example, the DLL update may also be deactivated upon other activation of the memory, such as activation of the ACT, READ, and/or WRITE commands. Accordingly, the scope of the disclosure should not be limited any of the specific embodiments described herein.

Various embodiments described with reference to FIGS. 1-7 provide advantages over existing systems in that the DLL update to one or more memory cell arrays is deactivated responsive to activation of certain memory operations, e.g., refresh operation. This minimizes the effect on the DLL update during certain memory operations, which helps the phase lock level in the DLL update circuit to be maintained in a desired range after these memory operations are completed. As such, certain memory operations, e.g., refresh operation, may not adversely affect the performance of the DLL update after the refresh operation is completed.

Certain details are set forth below to provide a sufficient understanding of examples of various embodiments of the disclosure. However, it is appreciated that examples described herein may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

What is claimed is:

1. An apparatus comprising an internal clock generator circuit, the internal clock generator circuit comprises:
   a delay locked loop (DLL) control circuit comprising:
      a plurality of D flip-flop circuits serially coupled and configured to provide an active DLL update signal responsive to a DLL update trigger signal, wherein a duration of the active DLL update signal is determined at least based on a number of D flip-flop circuits of the plurality of D flip-flop circuits; and
      an output circuit coupled to the plurality of D flip-flop circuits, the output circuit is configured to:
         pass through the active DLL update signal when an internal refresh command is inactive; and
         provide an inactive DLL update signal when the internal refresh command is active.

2. The apparatus of claim 1, further comprising a DLL update circuit coupled to the output circuit of the DLL control circuit, wherein the DLL update circuit is activated responsive to the active DLL update signal, and wherein the DLL update circuit is deactivated responsive to the inactive DLL update signal.

3. The apparatus of claim 2 wherein the DLL update circuit comprises an activation circuit coupled to the DLL control circuit and an adjustable delay line, the activation circuit configured to:
   provide an output of the adjustable delay line to a phase detect circuit responsive to the active DLL update signal; and
   not provide the output of the adjustable delay line to the phase detect circuit responsive to an inactive DLL update signal.

4. The apparatus of claim 1, further comprising an update trigger generator configured to provide the DLL update trigger signal the plurality of D flip-flop circuits, wherein the DLL update trigger signal includes a pulse.

5. The apparatus of claim 1, further comprising:
   an update trigger generator configured to provide an update trigger signal including multiple activation pulses; and
   a trigger circuit configured to receive the update trigger signal, the DLL update signal, and the internal refresh command, the trigger circuit further configured to provide the DU update trigger signal responsive to an activation pulse of the update trigger signal and provide the DLL update trigger signal responsive to an active internal refresh command becoming inactive.

6. The apparatus of claim 5 wherein the trigger circuit comprises:
   a set circuit configured to provide a set signal responsive to the internal refresh command becoming active;
   a reset circuit configured to provide a reset signal responsive to the refresh command becoming inactive subsequent to becoming active;
   a latch circuit coupled to the set circuit and the reset circuit and configured to provide a first pulse based on the set signal and the reset signal; and
   a pulse generator coupled to the latch circuit to receive the first pulse and provide a second pulse based on the first pulse.

7. The apparatus of claim 1 wherein each of the plurality of D flip-flop circuits is configured to receive the DLL update trigger signal at a set terminal and is further configured to receive the internal refresh command at a reset terminal, and wherein the output circuit is configured to receive the internal refresh command.

8. The apparatus of claim 1 wherein the plurality of D flip-flop circuits comprises an odd number of D flip-flop circuits.

9. The apparatus of claim 1 wherein the plurality of D flip-flop circuits and the output circuit are included in an update sequencer circuit, the update sequencer circuit configured to provide a pulse having a rising edge and a falling edge, the update sequencer circuit further configured to provide the rising edge responsive to a first pulse in the DLL update trigger signal, and to provide the falling edge responsive to activation of the internal refresh command.

10. An apparatus comprising:
    a delay locked loop (DLL) control circuit including an update sequencer and an update trigger generator, the update sequencer including a plurality of D flip-flop circuits serially coupled and an output circuit, the DLL control circuit configured to provide an active DLL update signal responsive to a DLL update trigger signal and provide an inactive DLL update signal when an internal refresh command is active, the update trigger generator configured to provide an update trigger signal including multiple activation pulses.

11. The apparatus of claim 10 wherein the plurality of D flip-flop circuits are configured to receive the DLL update trigger signal at a respective set terminal and further configured to receive the internal refresh command at a respective reset terminal, and wherein the output circuit is configured to receive the internal refresh command.

12. The apparatus of claim 10, further comprising a DLL update circuit configured to be activated responsive to the active DLL update signal and to be deactivated responsive to the inactive DLL update signal, the DLL update circuit comprising:
    an adjustable delay line configured to provide phase change to a phase controlled internal clock based on an internal clock;
    delay control logic configured to provide a phase value to the adjustable delay line to control the amount of delay of the adjustable delay;
    a replica delay circuit configured to provide a model delay;
    a phase detect circuit configured to compare the phase between the internal clock and the phase controlled internal clock provided through the replica delay circuit; and
    an activation circuit configured to provide an output of the adjustable delay line to the phase detect circuit responsive to the active DLL update signal, and further configured to block the output of the adjustable delay line to the phase detect circuit responsive to an inactive DLL update signal.

13. The apparatus of claim 10 wherein the update trigger generator is configured to provide the update trigger signal as the DLL update trigger signal to the update sequencer.

14. The apparatus of claim 10, further comprising:
    a trigger circuit configured to receive the update trigger signal, the DLL update signal, and the internal refresh command, the trigger circuit further configured to provide an active DLL update trigger signal responsive to an activation pulse of the update trigger signal and provide the active DLL update trigger signal responsive to an active internal refresh command becoming inactive.

15. The apparatus of claim 10, wherein the output circuit is coupled to the plurality of D flip-flop circuits, and the output circuit is configured to pass through the active DLL update signal when the internal refresh command is inactive and provide the inactive DLL update signal when the internal refresh command is active.

16. A method, comprising:
providing an active DLL update signal responsive to a DLL update trigger signal, wherein a duration of the active DLL update signal is determined based at least in part on a number of D flip-flop circuits of a plurality of D flip-flop circuits;
passing through an output circuit the active DLL update signal internal refresh command is inactive; and
providing an inactive DLL update signal from the output circuit when the internal refresh command is active.

17. The method of claim 16, further comprising providing the DLL update trigger signal responsive to an active update trigger signal from an update trigger generator and providing the DLL update trigger signal responsive to an active internal refresh command becoming inactive.

18. The method of claim 16 wherein providing the active DLL update signal responsive to the DLL update trigger signal comprises providing a pulse having a rising edge and a falling edge, the rising edge provided responsive to a first pulse in the DLL update trigger signal, and the falling edge provided responsive to propagating an active signal through the plurality of D flip-flop circuits.

19. The method of claim 18 wherein the falling edge is also provided responsive to the activation of the internal refresh command.

20. The method of claim 18 wherein the rising edge is also provided responsive to completion of a memory refresh operation.

* * * * *

UNITED STATES PATENT AND TRADEMARK OFFICE
CERTIFICATE OF CORRECTION

| | | Page 1 of 1 |
|---|---|---|
| PATENT NO. | : 11,676,650 B2 | |
| APPLICATION NO. | : 17/362822 | |
| DATED | : June 13, 2023 | |
| INVENTOR(S) | : Kazutaka Miyano et al. | |

It is certified that error appears in the above-identified patent and that said Letters Patent is hereby corrected as shown below:

In the Claims

| Column | Line | Claim | Reads | Should Read |
|---|---|---|---|---|
| 13 | 45 | 5 | "the DU update trigger signal" | --the DDL update trigger signal-- |

Signed and Sealed this
Thirty-first Day of December, 2024

Derrick Brent
*Acting Director of the United States Patent and Trademark Office*